United States Patent
Schulze-Hagenest et al.

(10) Patent No.: US 8,758,969 B2
(45) Date of Patent: Jun. 24, 2014

(54) METHOD FOR PRODUCING AN ANTENNA STRUCTURE FOR AN RFID DEVICE, AND DRY TONER FOR USE IN PRODUCING SUCH ANTENNA STRUCTURE

(75) Inventors: Detlef Schulze-Hagenest, Molfsee (DE); Dinesh Tyagi, Fairport, NY (US)

(73) Assignee: Eastman Kodak Company, Rochester, NY (US)

( * ) Notice: Subject to any disclaimer, the term of this patent is extended or adjusted under 35 U.S.C. 154(b) by 845 days.

(21) Appl. No.: 12/809,698

(22) PCT Filed: Dec. 22, 2007

(86) PCT No.: PCT/EP2007/011412
§ 371 (c)(1),
(2), (4) Date: Sep. 23, 2010

(87) PCT Pub. No.: WO2009/080087
PCT Pub. Date: Jul. 2, 2009

(65) Prior Publication Data
US 2011/0017834 A1      Jan. 27, 2011

(51) Int. Cl.
*G03G 9/00*     (2006.01)
*G03G 13/08*   (2006.01)

(52) U.S. Cl.
USPC .................. 430/109.5; 430/109.4; 430/111.4; 430/120.2; 430/123.56; 977/773

(58) Field of Classification Search
USPC ........ 430/109.4, 109.5, 111.4, 120.2, 123.56; 235/492; 977/773
See application file for complete search history.

(56) References Cited

U.S. PATENT DOCUMENTS

| | | | |
|---|---|---|---|
| 4,469,625 A * | 9/1984 | Held | 252/514 |
| 6,274,412 B1 | 8/2001 | Kydd et al. | |
| 2006/0071084 A1 | 4/2006 | Detig et al. | |
| 2007/0007344 A1 * | 1/2007 | Inoue et al. | 235/435 |
| 2007/0103308 A1 * | 5/2007 | Chiu | 340/572.7 |
| 2007/0234918 A1 * | 10/2007 | Hirahara et al. | 101/483 |

FOREIGN PATENT DOCUMENTS

| | | | |
|---|---|---|---|
| DE | 103 53 994 | | 6/2005 |
| EP | 1 841 301 | | 10/2007 |
| JP | 403089359 | * | 4/1991 |
| JP | 2004 062032 | | 2/2004 |
| JP | 2004-093786 | | 3/2004 |

* cited by examiner

*Primary Examiner* — Thorl Chea

(57) ABSTRACT

A method for producing an antenna structure for an RFID device, a dry toner for use in producing an antenna for an RFID device and a RFID device comprising an antenna structure made of fused toner are disclosed. In a method for producing an antenna structure for an RFID device, a dry toner comprising a polymeric binder and metallic particles is provided. The toner comprises particles having a resistance allowing triboelectric charging or a resistance allowing inductive charging, wherein said metallic particles are nanoparticles having a mean particle size below approximately 500 nm in at least one direction. In the method, a continuous layer of the dry toner is applied to a substrate in a desired shape of an antenna via an electrophotographic printing process, and subsequently the toner is fused to the substrate by heating the toner above its glass transformation temperature. The dry toner for use in producing an antenna for an RFID device comprises toner particles having a resistance allowing triboelectric charging or a resistance allowing inductive charging. The toner particles comprise a polymeric binder and metallic particles, wherein said metallic particles are nanoparticles having a mean particle size below approximately 500 nm in at least one direction.

36 Claims, 2 Drawing Sheets

METHOD FOR PRODUCING AN ANTENNA STRUCTURE FOR AN RFID DEVICE, AND DRY TONER FOR USE IN PRODUCING SUCH ANTENNA STRUCTURE

BACKGROUND OF THE INVENTION

The present invention relates to a method for producing an antenna structure for an RFID device, and a dry toner for use in producing an antenna for an RFID device. The present invention also relates to an RFID device comprising an antenna structure made of fused toner.

In different environments radio frequency identification devices commonly also referred to as RFID devices or tags are known. RFID-tags are for example known in identifying and tracking stock in a warehouse. The RFID-tags typically have an electronic circuit formed on a silicon chip and an antenna structure tuned to a specific frequency. Coupling to a reading device is typically done inductive or electromagnetic.

As there is a tendency to replace current barcode identification of products by RFID devices, there is a need to lower the cost for producing the RFID device.

One method proposed for producing the antenna structure for an RFID device uses a screen printing process. Such a process, however, necessitates the production of a suitable mask for the antenna structure, which is not cost effective in applications in which only a limited number of devices with the specific antenna structure is to be printed.

DE 103 53 994 A1 suggests a method for producing an RFID chip having an electronic circuit and an antenna structure coupled thereto. It is suggested to manufacture the antenna structure by an electrophotographic printing method. The document, however, does not indicate a suitable toner used in a printing process.

SUMMARY OF THE INVENTION

It is therefore an object of the present invention to provide a functional method for producing an antenna structure for an RFID device and for a toner to be used in such a method, which overcomes one or more of the problems of the art.

In accordance with the present invention, a method for producing an antenna structure for an RFID device is provided.

In a method for producing an antenna structure for an RFID device, a dry toner comprising a polymeric binder and metallic particles is provided. The toner comprises particles having a resistance allowing triboelectric charging or a resistance allowing inductive charging, wherein said metallic particles are nanoparticles having a mean particle size below approximately 500 nm in at least one direction. In the method, a continuous layer of the dry toner is applied to a substrate in a desired shape of an antenna via an electrophotographic printing process, and subsequently the toner is fused to the substrate by heating the toner above its glass transformation temperature.

The RFID device comprises an antenna structure made of fused toner made of a polymeric binder and metallic nanoparticles having a mean particle size below approximately 500 nm in at least one direction. The antenna structure has a resistance of approx 4 to 6 Ω/cm along its direction of extension.

The toner for use in producing an antenna for an RFID device comprises toner particles having a resistance allowing triboelectric charging or a resistance allowing inductive charging. The toner particles comprise a polymeric binder and metallic particles, wherein said metallic particles are nanoparticles having a mean particle size below approximately 500 nm in at least one direction.

The foregoing and other objects, features and advantages of the present embodiments will be apparent from the following more detailed description of exemplary embodiments, of the method and the toner, as illustrated in the accompanying drawings.

DESCRIPTION OF PREFERRED EMBODIMENTS

The following description uses relative terms such as left, right, above and below which relative terms refer to the drawings and should not be construed to limit the application.

Figure 1:
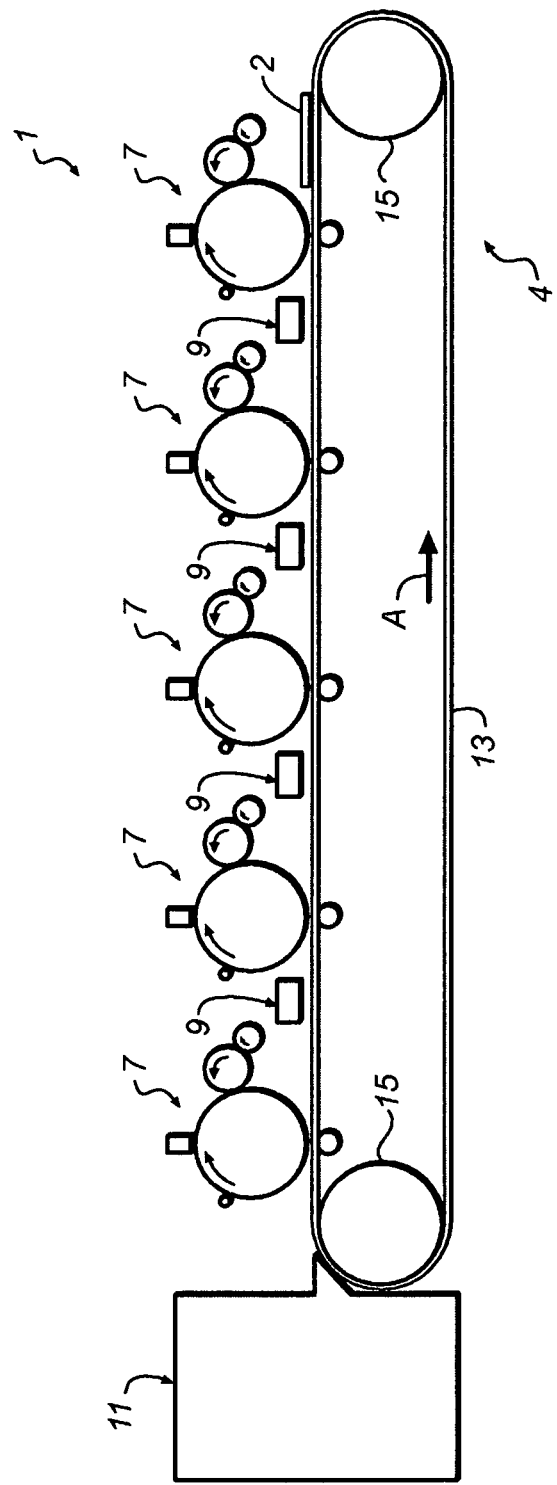
FIG. 1 is an exemplary side elevational view of part of an electrophotographic printing apparatus.

FIG. 1 illustrates a side elevational view of part of an electrophotographic printing apparatus 1, for printing onto a substrate 2, such as for example paper, packaging board, adhesive tags or any other suitable substrate. The printing apparatus 1 as shown has a substrate transport arrangement 4, five print modules 7, four charge neutralizing devices 9, and a fuser arrangement 11.

The substrate transport arrangement 4 is made of a transport belt 13, which is entrained about two rollers 15, at least one of which is coupled to a drive mechanism (not shown) to move the transport belt 13 in a circular path around the rollers 15, as indicated by arrow A.

Figure 2:
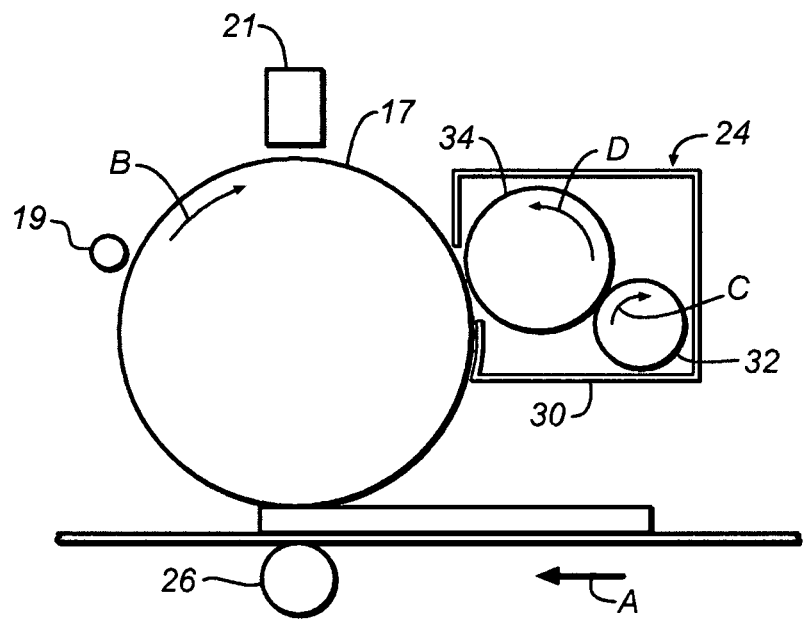
FIG. 2 is an enlarged side elevational view of an electrophotographic print module of the apparatus shown in FIG. 1.

The five print modules 7, one of which is shown enlarged in FIG. 2, each have a photoconductor drum 17, a charge device 19, a selective discharge device 21, a toner application device 24 and a transfer roller 26. Suitable toner application devices are described e.g. in U.S. Pat. No. 4,546,060 and US 20060177240.

The photoconductor drum 17 may be of a known type having a photoconducting surface. The photoconductor drum 17 is coupled to a drive mechanism (not shown), for rotating the drum in the direction of arrow B. The charging device 19 may be any suitable device for homogenously charging the outer surface of the photoconductor drum, such as a corona discharge device. The selective discharging device is typically a device capable of selectively directing light onto the charged surface of the photoconductor, to thereby selectively locally discharge the outer surface of the photoconductor drum 17. In so doing, a latent charge image may be formed on the outer surface of the photoconductor drum 17. A typical device used for this purpose is an LED arrangement having a plurality of light emitting diodes arranged in series across the entire width of the photoconductor drum. Each diode addresses one print dot and the spacing between the LED's corresponds to the resolution desired for the printed image.

The toner application device 24 as shown has a housing 30, in which a magnet roller 32 and a development roller 34 are housed. The housing 30 is partially filled with toner and optionally a (magnetic) carrier. A specific toner used for printing an antenna structure for an RFID device will be described herein below. The magnet roller 32 is arranged such that it contacts the toner and optionally the carrier, and is coupled to a drive device for rotating the magnet roller 32 in the direction of arrow C. The development roller 34 is arranged with respect to the magnet roller 32, such that during operation of the toner application device 24, toner and optionally carrier may be transferred from the magnet roller 32 to the development roller in a known manner. During the take up of the toner and optionally the carrier by the magnet roller and during the transport thereof, the toner may be triboelectrically charged, in cases where the toner particles have a resistance above $1*10^{11}$ Ω. In cases where the toner has a resistance of the toner is below $1*10^{8}$Ω, inductive charging of the toner particles is possible. The development roller 34 is arranged with respect to the photoconductor drum 17, such that a small nip is formed therebetween. The toner maybe developed in contact with the photoconductor or may jump over a small gap.

Transfer roller 26 is arranged below the photoconductor drum 17, such that a nip is formed there between through which the transport belt 13 and substrate 2 may pass, while ensuring that the substrate 2 is pressed against the photoconductor drum. The above is only one of a number of possibilities for the structure of the print module, and the skilled person will easily recognize other structures. It is also possible to provide a different number of print modules 7. In one application, a single print module 7 may be sufficient for printing an antenna structure for an RFID-device. In some applications several print modules 7 may be needed for printing an antenna structure, if several toner layers are required. In yet other applications, some of the print modules 7 may be used for printing an antenna structure, while others may be used for printing an image using regular toner.

Returning to FIG. 1, four discharge devices 9 are provided, one each between the print modules 7. The discharge device may be any device capable of discharging a substrate passing thereunder, such as a passive element like metallic hair bushes or an active discharge device e.g. a corona device such as a corotron or a scorotron. Alternatively or in addition, the discharge device 9 may also comprise one or more of the following: a hot air or steam application device, a hot roller, a UV, visible or infrared light source, a radio frequency or microwave energy application device. Also a calendar roller or a pressure roller may be used for discharging toner applied to the surface of the substrate 2.

The fuser apparatus 11 is arranged at the downstream end of the transport arrangement 4, and has an internal transport arrangement for transporting a substrate 2 which is transferred from the transport arrangement 4 through the fuser apparatus 11. The fuser apparatus 11 is preferably a non-contact fusing apparatus using one or more of the following heating mechanisms: pulsed or continuous radiation heating, convection heating and microwave or radio frequency heating for heating toner applied to a substrate, for heat fusing the same. Alternatively or in combination therewith a contact fusing arrangement may be provided in the fuser apparatus. Such a contact fusing arrangement may for example have a pair of pressure rollers, at least one of which may be heated. Such pressure rollers may also be used in combination with a fuser belt, which may be heated to extend the fusing time for the toner over an extended period of time.

Figure 3:
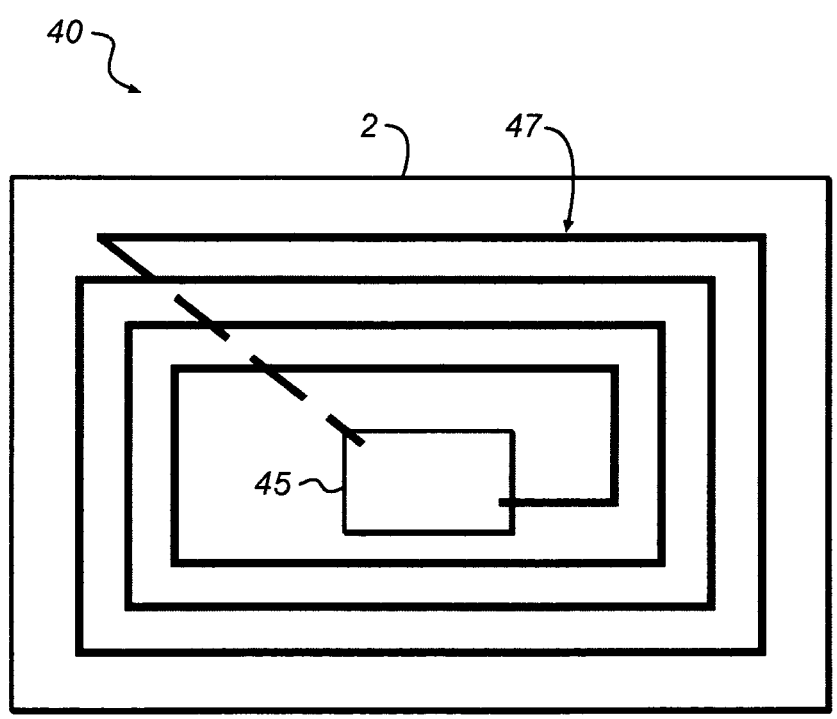
FIG. 3 is an exemplary top view onto an RFID device.

FIG. 3 shows a top view of an RFID device 40 formed on a substrate 2. The RFID device has an electronic circuit 45, which is typically formed on a silicon chip, and an antenna structure 47, which according to the present invention is formed by an electrophotographic printing process as will be explained herein below.

Toner suitable for use in the electrophotographic printing apparatus 1 described above and for producing an antenna structure for an RFID device such as the one shown in FIG. 3, will be described herein below.

The toner in particle form should be chargeable either via triboelectric charging (in which case the toner particles should have a resistance above $1*10^{11}$Ω) or via inductive charging (in which case the toner should have a resistance $1*10^{8}$Ω).

Different types of metallic toners are contemplated.

A first toner may for example comprise Metal flakes, which are commonly used for conductive metallic pastes—typically silver. Such flakes may be dispersed into a low viscosity polymeric, particularly a polyester binder known for toner applications. Toner additives like Octadecanamide (commonly known as Stearamide) may be used as second binder component to adjust the melting characteristic and the viscosity of the toner. Experiments have shown, that the addition of Octadecanamide as a secondary binder material may substantially lower the viscosity of the toner. In one example, the viscosity of a toner having 100% of a polyester binder showed a viscosity of 6 kPoise. After addition of 20% by weight of Octadecanamide the viscosity was lowered to 0.12 kPoise. In a similar example it was found that another toner had a viscosity of 1.4 kPoise without Octadecanamide and showed a viscosity of 0.29 kPoise after an addition of 10% by weight of Octadecanamide and a viscosity of 0.13 kPoise after an addition of 20% of Octadecanamide. In yet another Example, it was found that the toner had a viscosity of 0.37 kPoise without Octadecanamide and showed a viscosity of 0.03 kPoise after an addition of 20% by weight of Octadecanamide. Thus it becomes clear that the addition of Octadecanamide may be used to adjust the viscosity to a desired level. Furthermore, the addition of Octadecanamide may also lead to sharper melting characteristics of the toner. A viscosity of the toner in the range of 0.3 to 6 kPoise is preferred in the present application for the toner.

The metallic flakes are the main conductive element of the ink. By adjusting the relative concentration of the metallic flakes and the binder(s), viscosity and conductivity of the toner can be tuned. Metallic fakes suitable for this applications are supplied e.g. by Eckart, Velden, Germany. In an specific embodiment the metallic flakes may be attached to the surface of clear or pigmented toner cores, as for example described in WO 2005/076086 and/or WO2007/006481.

Principally organometallic precursors may also be suitable for antennas and wiring of RFID. As the volume fraction of metal is low (typically few percentage) the final metallic film received after fusing is porous if not compacted. Nevertheless it maybe used as thin seed layer with additional thick plated layer maybe applied. Metal oxide pigments dispersed in polymeric binder could also be used. The metal oxide pigments dispersed in the polymeric binder may then be deoxidized later in the production process of the RFID device.

In the preferred practice, however, metallic nanoparticles having a mean particle size below approximately 500 μm in at least in one direction, and being dispersed in a polymeric binder such as the one described above, are used for the toner. Metallic particles made of silver or copper are contemplated for use in the toner composition, but nanoparticles of other metals having a good conductivity may be used. The use of Nanoparticles has shown an increase of the conductivity of the final antenna structure compared to the use of metal flakes at comparable toner viscosity. The nanoparticles may for example be produced by sputtering or wet techniques. Such particles are for example available as Mitsui SPQ03S Silver particles from Mitsui Mining & Smelting Co., Ltd. utilizing the web process. The median particle size of these particles is 0.52 μm.

Even more preferably metallic nanoparticles having a mean particle size below 100 nm or even below 10 nm in at least one direction are dispersed in a polymeric binder such as the one described above. Such nanoparticles show a reduced melting temperature compared to the bulk material as the net properties of the particles depend more on the surface properties of the particles than on the bulk properties. The bonding of atoms at the surface is weaker than the bonding energies in the bulk material. For example gold nanoparticles with diameter of approximately 2 nm melt at about 100° C. whereas bulk gold melts at about 1000° C. In reducing the melting temperature of the metallic particles, the fusing temperatures commonly used for toner application may be sufficient to melt not only the binder materials but also the metallic particles. Melting of the metallic particles during a fusing step, however, allows better contacts of the metallic particles in the toner compared to metallic particles which are not melted and only contact each other in the toner. Conductivities in the range of 30-70% of bulk density can be achieved, when metal particles are melted during fusing of the toner. Such nanoparticles may for example be produced in a wet process and are quickly encapsulated to prevent from fusing together in the solution. The particles are then incorporated into a toner e.g. via a wet cake process. Such particles are for example available as Harima Nanopaste™ Silver nanoparticles produced by Harima Chem. Ind. Inc.

The toner particles each have in common, that they preferably have mean particle sizes in the range of 12 μm to 30 μm and in particular in the range of 20 μm to 30 μm, which is larger than the mean particle size typically used in commercial printing on paper. These particle sizes facilitate layer thickness after printing and fusing, which achieve the desired conductivity and reliability of an antenna structure for an RFID-device. In cases where a single layer is not sufficient, two or more layers may be used of the same or different toner material. The toner may be a clear toner, i.e. a toner not having colored pigments, in which case the antenna structure is barely visible or a colored toner. The toners are preferably heat curable toners, but UV or electron beam curable toners are also contemplated. The toner preferably comprises binder material in the range of 5 to 25% by weight of the toner, in particular in the range of 10 to 20% by weight of the toner. At present a toner having binder material of 15% by weight of the toner is contemplated.

The toner material may for example include one or more of the following: polymer, charge control agent, optional colorant, and fumed metal oxide like silica, titania, or aluminia hydrophobically surface coated. the present invention can conform to any well-known process for preparing dry toners wherein pigments are conventionally incorporated in a toner core, i.e., for example by compounding, classifying and/or grinding. Instead of embedding pigments in a toner core it is also possible, for example, to utilize a shell construction wherein a pigment is applied to the surface of a toner body, especially as part of a coating, optionally alone or mixed with other ingredients, for example with polymers, waxes, or charge control agents. Illustrative references are U.S. Pat. No. 5,298,356, issued on Mar. 29, 1994 and/or U.S. Pat. No. 6,110,633, issued on Aug. 29, 2000, the disclosures of which are hereby incorporated by reference thereto.

Finally the inventive toner maybe coated with an additional component on the surface consisting of hydrophobic fumed metal oxides like silica, aluminia, or titania in concentrations of about 0.1% to about 3%.

The toners may be alternatively produced by so-called chemical toner processes, called as well "chemically prepared toners", "polymerized toners" or "in situ toners". The toners are not produced by grinding but by controlled growth. Chemical process to be used are, among others, suspension polymerization (e.g., DE 4202461, DE 4202462); emulsion aggregation (e.g., U.S. Pat. No. 5,604,076, issued on Feb. 18, 1997); micro-encapsulation (e.g., DE 10011299); dispersion (e.g., U.S. Publication No. 2003/0087176 A1, published on May 8, 2003); or chemical milling (e.g., proceedings of IS&T NIP 17: International Conference on Digital Printing Technologies, IS&T: The Society for Imaging Science and Technology, 7003 Kilworth Lane, Springfield, Va. 22151 USA ISBN: 0-89208-234-8, p. 345). The disclosures of al the above references are hereby incorporated by reference thereto.

In the following, a method of printing an antenna structure for an RFID-device will be described with reference to the drawings. In the following it is assumed, that the first three printing modules 7 of the printing apparatus 1 contain a toner as described above, i.e. a toner having at least a polymeric binder and metallic particles. The remaining two printing modules contain regular commercial toner of a desired color, e.g. for printing a two color image onto and/or next to an antenna structure. All of the toners are heat curable toners, even though it is also possible to use for example UV or electron beam curable toners.

At first, a suitable substrate such as a paper board is transported into the printing apparatus 1 from the right hand side. The first printing module 7 prints a desired antenna structure via an electrophotographic printing process onto the substrate, while the substrate is moved therethrough. In this process, the surface of the photoconductor drum 17 is charged by the corona device 19, while the photoconductor drum 17 is rotated. The discharge device 21 then selectively discharges parts of the surface of the photoconductor drum 17, to generate a latent charge image on the photoconductor drum 17, corresponding to the antenna structure to be formed. The toner application device 24 then selectively supplies toner to the surface of the photoconductor drum 17, in correspondence with the latent charge image thereon. The toner is then transported to the substrate 2 and transferred thereto.

After receiving the toner image, the substrate is moved to the second printing module. Between the first and second printing modules, the discharge device 9 discharges the toner image printed by the first print module. This may be done to avoid saturation effects. At the second printing module, the same printing process is repeated to get two superimposed layers of toner, in the shape of the desired antenna structure. The toner used in the second printing module 7 may be the same or a different one of the above described toners, as the one used in the first printing module 7.

The substrate is then moved to the third printing module. Between the second and third printing modules, the discharge device 9 discharges the toner image printed by the second print module. At the third printing module 7 printing process is again repeated to get a third layer of toner, in the shape of the desired antenna structure on top of the two already existing ones.

Subsequently the substrate is moved to the fourth and fifth printing modules, where for example a desired two color image independent of the antenna structure such as a company logo may be printed. It is also possible that a bar code is printed on top of the antenna structure, in cases where for example the toner used for the antenna structure is a clear toner.

Finally, the substrate is moved to the fuser, in which the toner deposited onto the substrate is fused thereto. In the fuser the toner is heated above the glass transformation temperature of the toner, and kept above this temperature for an extended period of time of preferably at least 1 to 10 seconds. Curing times in the range of 1 to 200 seconds or even larger are contemplated. The toner may also be heated above the melting temperature of the metallic particles in the toner, which melting temperature of the metallic particles is reduced with respect to the bulk material of the metal. In using metallic nanoparticles, the melting temperature thereof may be lowered to a range of typical fusing temperatures of a polymeric toner. During the fusing step a magnetic field may be applied to the toner to align the metallic particles in a desired direction Industrial Applicability The apparatus, toner and method described above may be used to produce an antenna structure for an RFID-device using an electrophotographic printing process. This process allows quick changes of the antenna structure for tuning to different frequencies, and even a small number of RFID devices having a certain antenna structure may be produced in a reliable cost effective manner.

The invention has been described with reference to specific embodiments thereof without being limited to the specifics thereof. The scope of the invention is defined only by the appended claims.

The invention claimed is:

1. A method for producing an antenna structure for an RFID device, said method comprising the steps of:
    providing a dry electrophotographic toner comprising a polymeric binder and metallic particles, said toner comprising particles having a resistance allowing triboelectric charging or a resistance allowing inductive charging, wherein said metallic particles are nanoparticles having a mean particle size below approximately 500 6nm in at least one direction;
    applying a continuous layer of said dry toner in a shape of an antenna onto a substrate via an electrophotographic printing process; and
    fusing the toner to the substrate by heating the toner above its glass transformation temperature so as to provide for an antenna structure for an RFID device;
    wherein said toner further comprises Octadecanamide as a second binder material.

2. The method of claim 1, wherein said polymeric binder is a polyester binder.

3. The method of claim 1, wherein said polymeric binder has a viscosity in the range of 0,3 to 6 kPoise at 120° C.

4. The method of claim 1, wherein Octadecanamide is provided in an amount of 5 to 25% by weight with respect to the total weight of the binder material.

5. The method of claim 1, wherein the resistance of resulting toner structure after fusing is adjusted to have a resistance of approximately 4to 6Ω/cm along its direction of extension, wherein adjustment of the resistance is adjusted by the dimensions of the toner structure, the choice of the materials forming the toner and the respective ratios of the materials forming the toner.

6. The method of claim 1, wherein the toner comprises binder material in the range of 5 to 25% by weight of the toner.

7. The method of claim 1, wherein the toner comprises binder material in the range of 10 to 20% by weight of the toner.

8. The method of claim 1, wherein said metallic particles have a mean particle size below 100 nm in at least one direction.

9. The method of claim 1, wherein said metallic particles have a mean particle size below 10 nm in at least one direction.

10. The method of claim 9, wherein said metallic particles have a mean particle size of approximately 2 nm in at least on direction.

11. The method of claim 1, wherein said toner particles have a mean particle size in the range of 12 µto 30 µm.

12. The method of claim 1, wherein said toner comprises particles having a mean particle size in the range of 20 µto 30 µm.

13. The method of claim 1, wherein two or more layers of said toner are printed on top of each other in said shape.

14. The method of claim 13, wherein after printing a toner layer and before printing another on top thereof, the already printed toner layer is electrically discharged.

15. The method of claim 1, wherein the toner fused in a noncontact manner by radiation fusing, convection fusing, microwave and/or radio frequency fusing.

16. The method of claim 1, wherein during the fusing step the toner is kept above its glass transformation temperature for an extended time period of more than 1 second.

17. The method of claim 1, wherein during the fusing step the toner is kept above its glass transformation temperature for an extended time period between 1 second and 200 seconds.

18. The method of any claim 1, wherein during the fusing step the toner is kept above its glass transformation temperature for an extended time period between 1 second and 10 seconds.

19. The method of claim 1, wherein during the fusing step the toner is heated above the melting temperature of the metallic particles.

20. The method of claim 1, wherein a magnetic field is applied to the toner at least during a portion of the time, at which the toner is heated above the glass transformation temperature of the toner or above the melting temperature of the metallic particles.

21. An RFID device comprising an antenna structure made of fused electrophotographic toner heated above its glass transformation temperature, the toner being made of a polymeric binder and metallic nanoparticles having a mean particle size below approximately 500nm in at least one direction, said antenna structure having a resistance of approximately 4 to 6 Ω/cm along its direction of extension, wherein said toner further comprises Octadecanamide as a second binder material.

22. An RFID device of claim 21, wherein said metallic nanoparticles have a mean particle size below 100 nm in at least one direction.

23. A dry electrophotographic toner for use in producing an antenna for an RFID device, said toner comprising toner particles having a resistance allowing triboelectric charging or a resistance allowing inductive charging, said toner particles comprising a polymeric binder and metallic particles, wherein said metallic particles are nanoparticles having a mean particle size below approximately 500 nm in at least one direction;
    wherein said toner further comprises Octadecanamide as a second binder material.

24. The dry toner of claim 23, wherein said polymeric binder is a polyester binder.

25. The dry toner of claim 24, wherein said polymeric binder has a viscosity in the range of 0.3 to 6 kPoise at 120° C.

26. The dry toner of claim 23, wherein Octadecanamide is provided in an amount of 5 to 25% by weight with respect to the total weight of the binder material.

27. The dry toner claim 23, wherein the toner comprises binder material in the range of 5 to 25% by weight of the toner.

28. The dry toner of claim 23, wherein the toner comprises binder material in the range of 10 to 20% by weight of the toner.

29. The dry toner of claim 23, wherein said metallic nanoparticles have a mean particle size below 100 nm in at least one direction.

30. The dry toner of claim 23, wherein said metallic nanoparticles have a mean particle size below 10 nm in at least one direction.

31. The dry toner of claim 30, wherein said metallic nanoparticles have a mean particle size of about 2 nm in at least one direction.

32. The dry toner of claim 23, wherein said toner comprises particles having a mean particle size in the range of 12 µm to 30 µm.

33. The dry toner of claim 23, wherein said toner comprises particles having a mean particle size in the range of 20 µm to 30 µm.

34. The dry toner of claim 23, wherein said toner is heat curable.

35. The dry toner of claim 23, wherein said toner is UV or electron beam curable.

36. A method for producing an antenna structure for an RFID device, said method comprising the steps of:

providing a dry electrophotographic toner comprising a polymeric binder and metallic particles, said toner comprising particles having a resistance allowing triboelectric charging or a resistance allowing inductive charging, wherein said metallic particles are nanoparticles having a mean particle size below approximately 500 nm in at least one direction;

applying a continuous layer of said dry toner in a shape of an antenna onto a substrate via an electrophotographic printing process; and fusing the toner to the substrate by heating the toner above its glass transformation temperature so as to provide for an antenna structure for an RFID device, wherein said fusing step causes the polymeric binder to adhere to said substrate and causes the metallic particles to melt.

* * * * *